United States Patent
Matumoto (10) Patent No.: US 6,653,169 B2
(45) Date of Patent: Nov. 25, 2003

(54) PACKAGED SEMICONDUCTOR AND PROCESS FOR MANUFACTURING THE SAME

(75) Inventor: Jirou Matumoto, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 43 days.

(21) Appl. No.: 10/057,907

(22) Filed: Jan. 29, 2002

(65) Prior Publication Data

US 2002/0066944 A1 Jun. 6, 2002

Related U.S. Application Data

(62) Division of application No. 09/481,685, filed on Jan. 12, 2000, now Pat. No. 6,344,681.

(30) Foreign Application Priority Data

Jun. 24, 1999 (JP) ............................................. 11-178181

(51) Int. Cl.[7] .......................... H01L 21/44; H01L 21/48; H01L 21/50
(52) U.S. Cl. ........................................ 438/112; 438/124
(58) Field of Search ................................ 438/112, 113, 438/106, 121–124

(56) References Cited

U.S. PATENT DOCUMENTS

| | | | |
|---|---|---|---|
| H054 H | * 4/1986 | Hixenbaugh et al. | 228/125 |
| 4,698,661 A | * 10/1987 | Bessonneau et al. | 257/664 |
| 5,528,458 A | * 6/1996 | Yasuho et al. | 361/718 |
| 5,592,020 A | * 1/1997 | Nakao et al. | 257/666 |
| 5,616,953 A | * 4/1997 | King et al. | 257/666 |
| 5,723,903 A | * 3/1998 | Masuda et al. | 257/696 |
| 5,763,829 A | * 6/1998 | Tomita et al. | 174/52.2 |
| 5,789,280 A | * 8/1998 | Yokota | 438/123 |
| 5,834,691 A | * 11/1998 | Aoki | 174/52.4 |
| 5,889,658 A | * 3/1999 | Sullivan et al. | 361/773 |
| 5,952,715 A | * 9/1999 | Sekiguchi et al. | 257/696 |
| 5,978,227 A | * 11/1999 | Burns | 361/735 |
| 5,984,699 A | * 11/1999 | Waki et al. | 439/123 |
| 6,002,167 A | * 12/1999 | Hatano et al. | 257/696 |
| 6,018,191 A | * 1/2000 | Murakami et al. | 257/691 |
| 6,107,676 A | * 8/2000 | Suzuki | 257/666 |
| 6,117,709 A | * 9/2000 | Hirose | 438/121 |
| 6,140,154 A | * 10/2000 | Hinkle et al. | 438/123 |

FOREIGN PATENT DOCUMENTS

JP          6-069396          3/1994

* cited by examiner

*Primary Examiner*—Craig Thompson
(74) *Attorney, Agent, or Firm*—Rabin & Berdo, P.C.

(57) ABSTRACT

A method of manufacturing a packaged semiconductor device includes mounting a semiconductor device having multiple leads. The leads are formed by mounting the semiconductor device in a lead frame and punching and sealing the leads in the semiconductor device using a resin. The leads are bent to a predetermined configuration while substantially simultaneously bending a connecting member that is used for connecting the leads to a frame. The resulting packaged semiconductor device has leads that are not cut off from the lead frame, and the connection between the two can be maintained even after a bending process is finished.

5 Claims, 11 Drawing Sheets

PACKAGED SEMICONDUCTOR AND PROCESS FOR MANUFACTURING THE SAME

CROSS REFERENCE TO RELATED APPICATION

This is a Divisional Application of application Ser. No. 09/481,685 filed Jan. 12, 2000 now U.S. Pat. No. 6,344,681.

BACKGROUND OF THE INVENTION

1. Field of the Invention

The present invention relates to a packaged semiconductor and a process for manufacturing the packaged semiconductor.

2. Description of the Related Art

Figure 10:
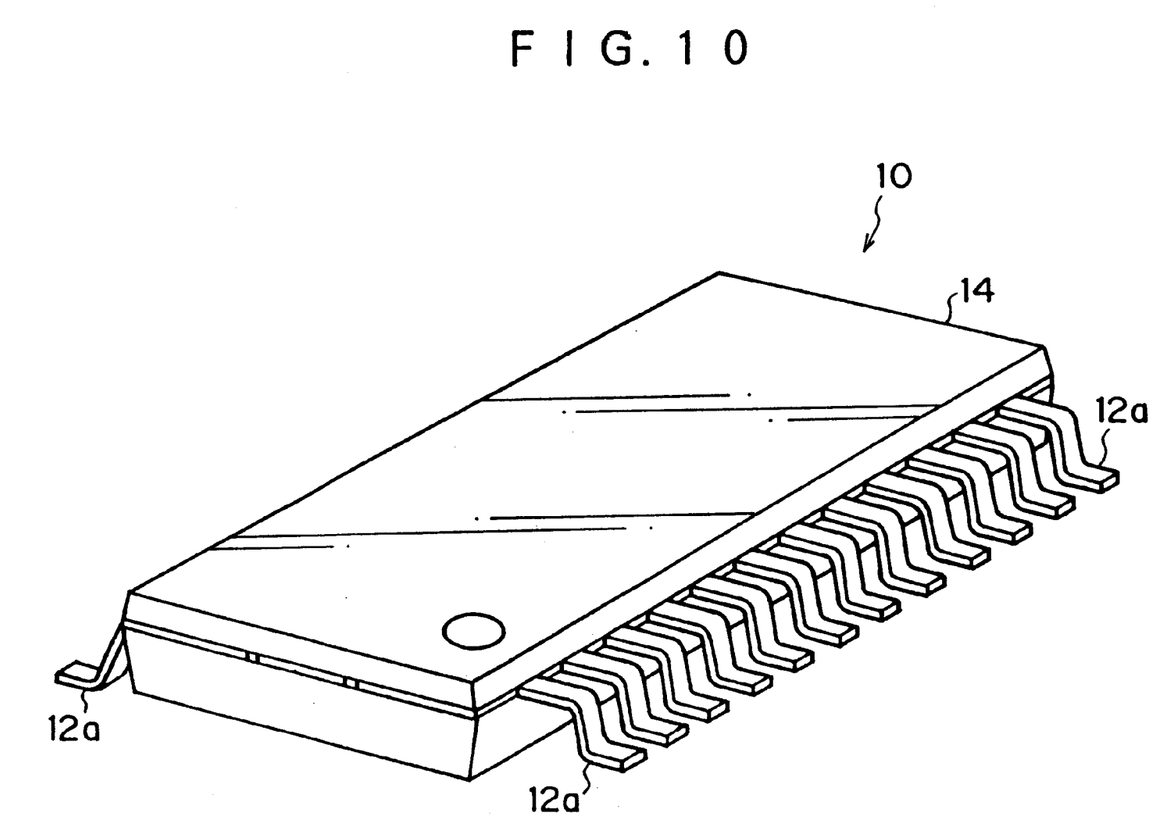
FIG. 10 is a perspective view of a packaged semiconductor.

A conventional packaged semiconductor 10 is, as shown in FIG. 10, provided with a package 14 in which a semiconductor device (not shown) mounted on an island (not shown) and a part of a lead frame 12 (see FIG. 7) are sealed with a resin and a plurality of leads 12a extending from the side of the package 14.

Figure 7:
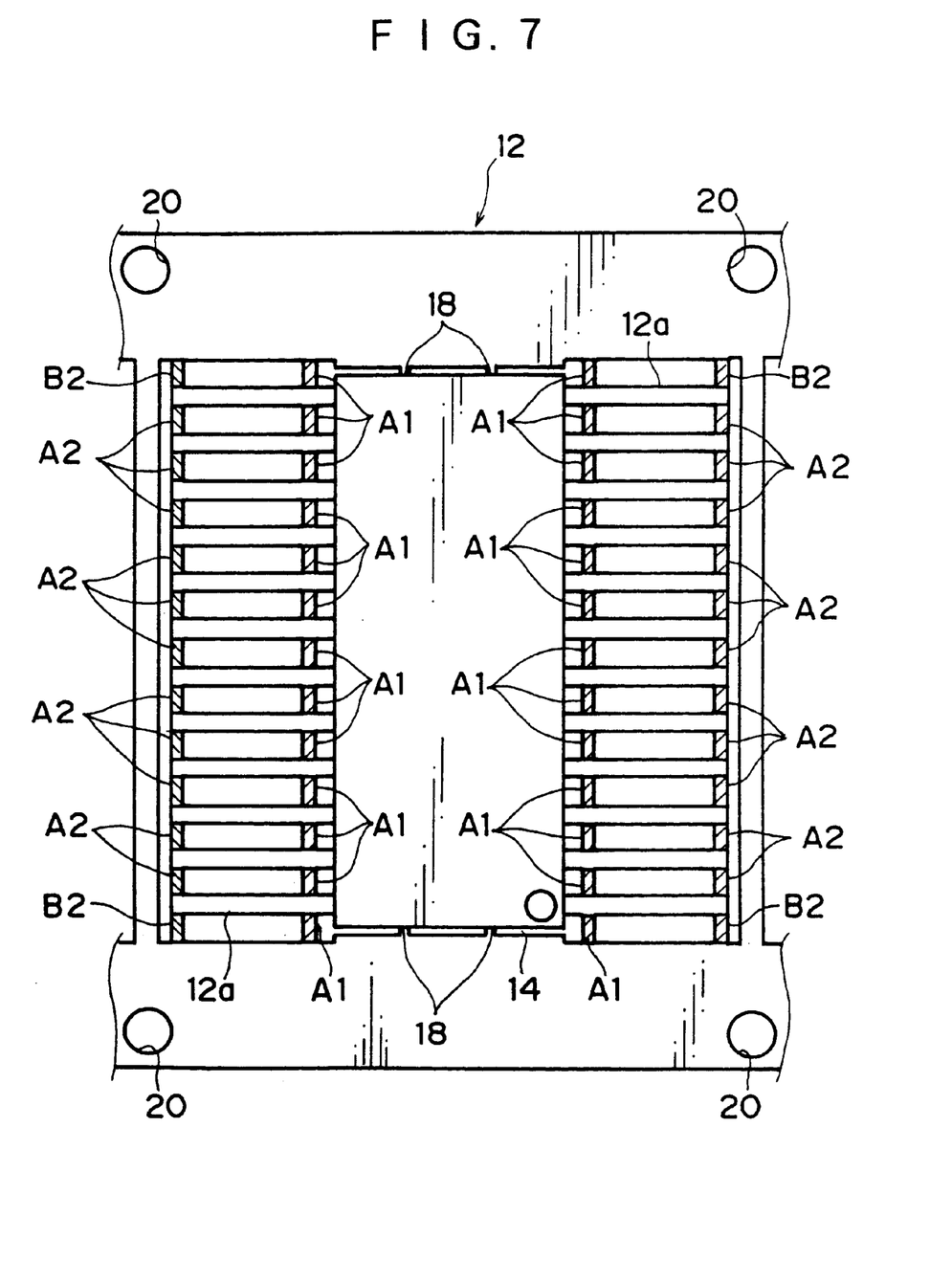
FIG. 7 is a top plan view showing the condition of a conventional lead frame before it is bent.

As shown in FIG. 7, each lead 12a is formed by punching the lead frame 12. The leads 12a are connected to each other by tie bars A2 and each outside lead 12a is connected to the lead frame 12 by a tie bar B2.

Dam bars (also called "tie bars") Al having the function of blocking the flow of the resin during the molding of the package 14 are used to connect the leads 12a to each other and each lead 12a with the lead frame 12. Also, the island is connected to the lead frame 12 through an island support pins 18.

A plurality of guide holes 20 which are openings used for positioning during the process of bending the leads 12a are formed in the lead frame 12. It is to be noted that the material generally used for the lead frame 12 is a 42 alloy (Fe, Ni) or a copper alloy with a plate thickness of approximately 0.15 mm.

Figure 11:
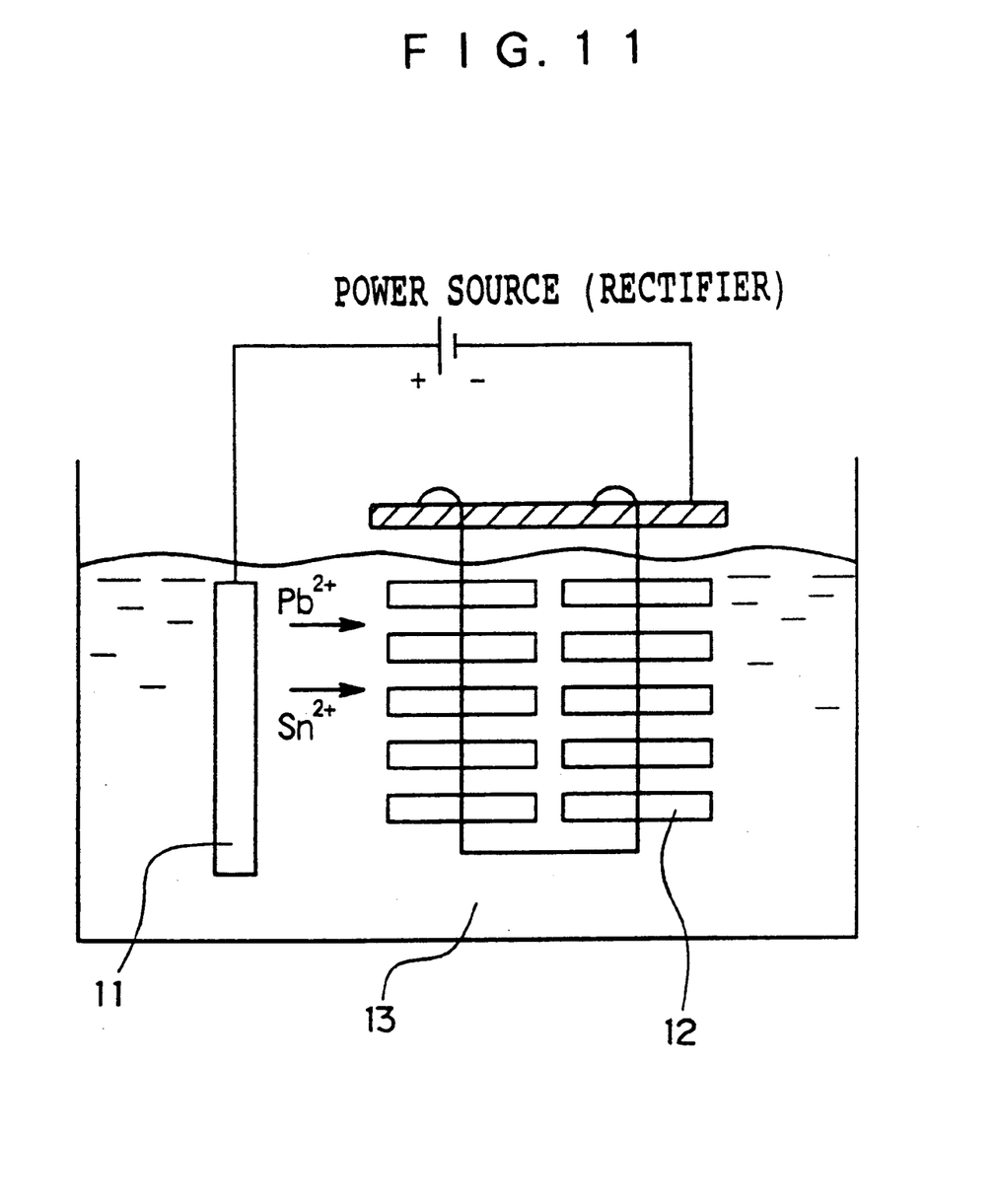
FIG. 11 is a schematic structural view of a solder plating apparatus.

The surface of the molded lead frame 12 (including the lead 12a) is provided with solder plating through electrical connection of the lead frame 12 to an external section. In the solder plating method, as shown in FIG. 11, the lead frame 12 and a solder electrode 11 (anode) are dipped in an acidic electrolyte 13 (solder plating bath) in which Sn and Pb have been dissolved as solder components in advance and are electrically connected to each other and energized, thereby electrodepositing solder (Sn and Pb) on the surface of the lead frame 12 (cathode).

Figure 8A:
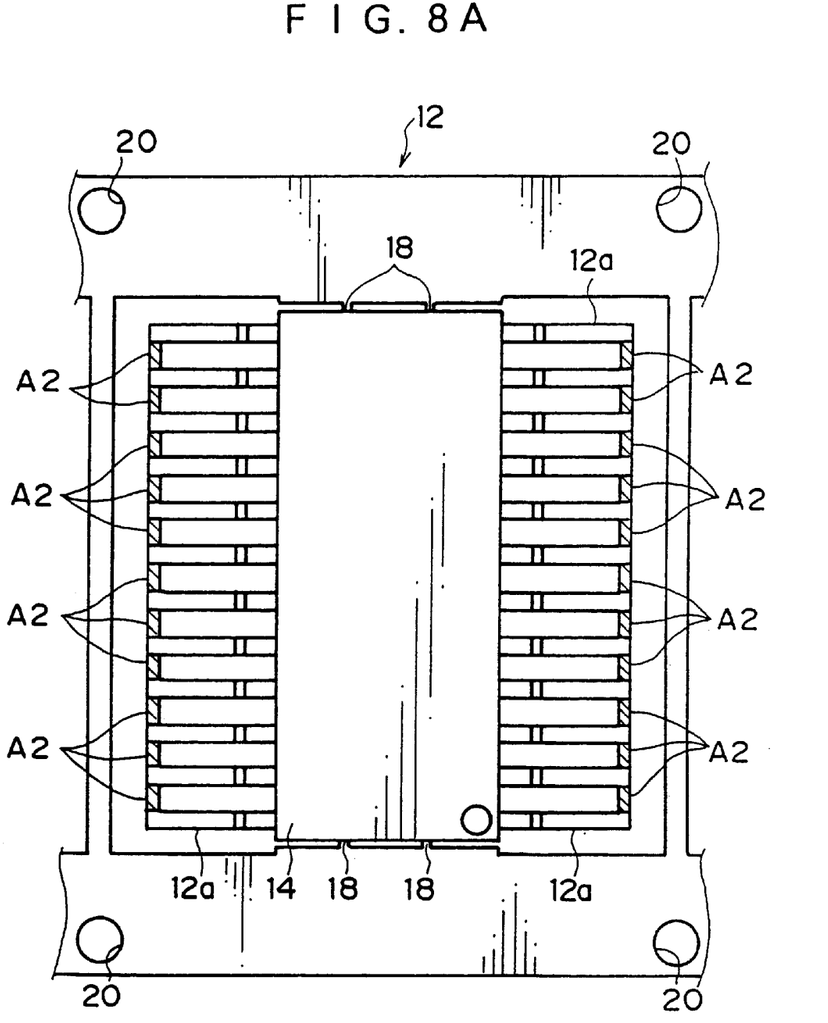
FIG. 8A is a top plan view showing the condition of the conventional lead frame after it is bent and FIG. 8B is a side view thereof.
Figure 8B:
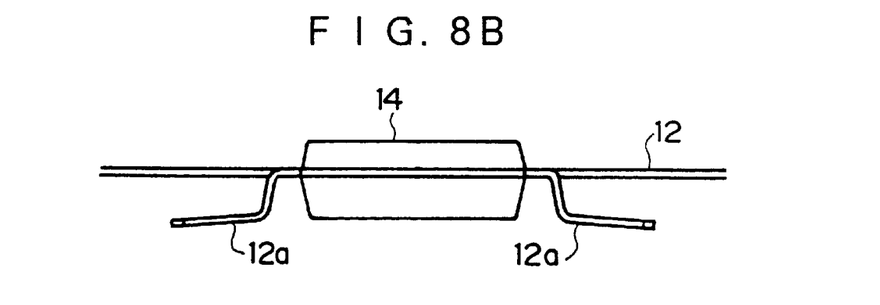

After the solder plating is finished, the lead 12a is processed into a predetermined shape. Specifically, in the step of processing the lead 12a, as shown in FIG. 7 and FIG. 8, all dam bars A1 are punched and next the tie bars B2 at both ends are punched using a metal mold. Thereafter bending of the lead 12a is performed.

Figure 9:
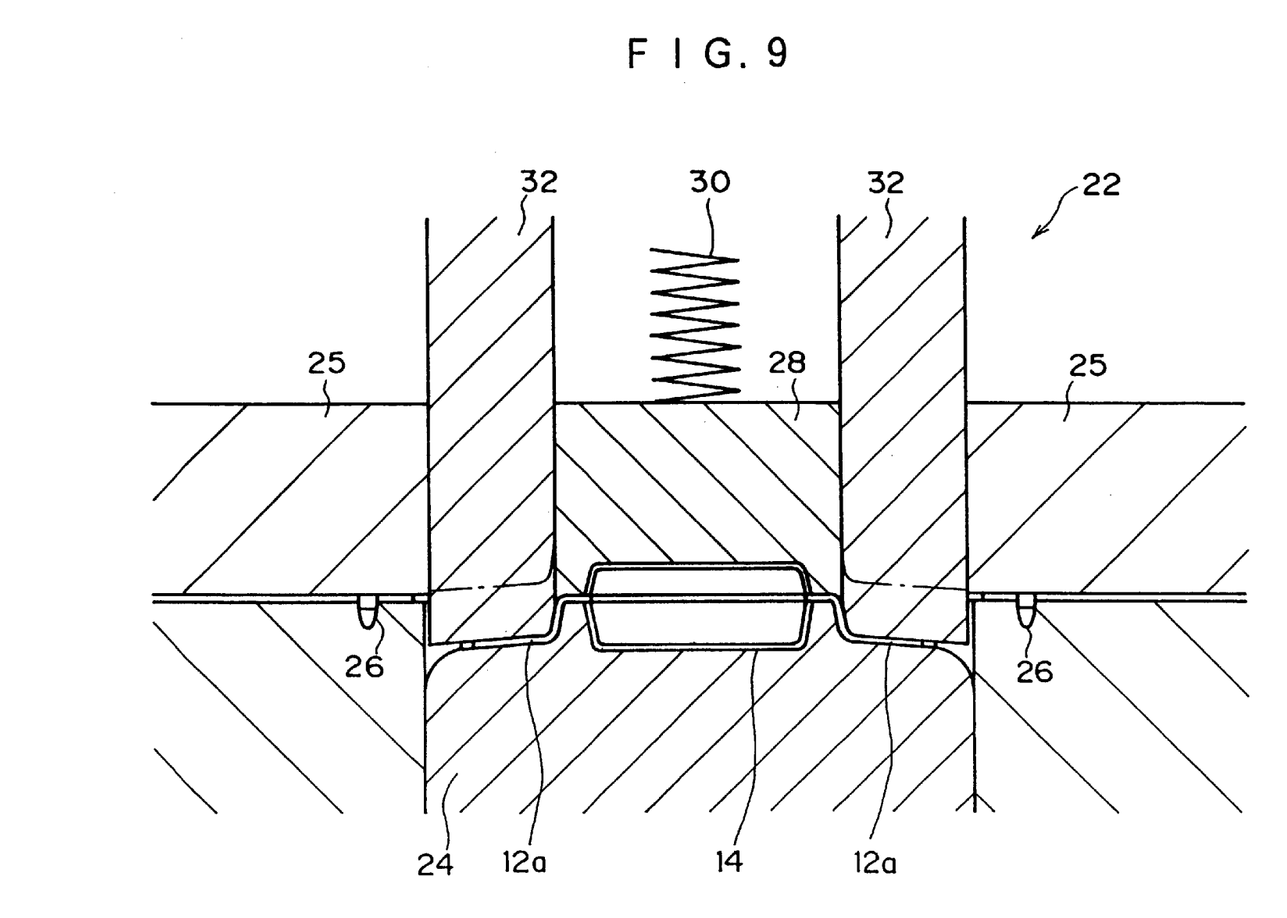
FIG. 9 is a schematic structural view of a forming die for bending.

This bending of the leads 12a is carried out using a forming die 22 as shown in FIG. 9. Namely, the lead frame 12 is automatically conveyed to and placed on a bending die 24 of the forming die 22 and an upper die 25 is allowed to descend. At this time, the pilot pin 26 mates with the guide hole 20 to position the lead frame 12. Next, the leads 12a disposed in the vicinity of the package 14 are sandwiched between a knockout 28 pushed by a spring 30 and the bending die 24. Thereafter, as shown in FIG. 8 and FIG. 9, the bending punch 32 is lowered so as to push down the end of each lead 12a, thereby performing the bending.

Next, the end portion of each lead 12a which includes the tie bar A2 is cut and the island support pins 18 are cut off from the lead frame 12 to complete the manufacture of the packaged semiconductor 10 shown in FIG. 10.

SUMMARY OF THE INVENTION

In the above bending process using a forming die, however, the solder plating on the surface of the lead is rubbed by the bending punch during the processing and the rubbed off solder plating is pressed against and laminated on the punching surface of the bending punch to create solder residue.

Moreover, this solder residue then comes off the punching surface of the bending punch during the bending of the lead and adheres again to the surface of the lead.

As a consequence, the above bending causes short circuiting between the leads as well as a deteriorated appearance, giving rise to serious problems in the quality of the product.

It is therefore necessary that the operation of the apparatus be frequently suspended to clean the forming die, remarkably impairing the production efficiency of the packaged semiconductor.

In light of the above problem, an object of the present invention is to provide a packaged semiconductor produced by performing solder plating after the bending of the leads has been completed so that no solder residue is created. Another object of the present invention is to provide a process for manufacturing a packaged semiconductor. According to a first aspect of the present invention, there is provided a packaged semiconductor comprising:

a semiconductor having a plurality of leads extending therefrom, the leads having been formed by mounting the semiconductor device in a lead frame and punching and sealing the leads in the semiconductor device using a resin, wherein the leads have been bent to a predetermined configuration; and connecting means for connecting said leads to said frame, said connecting means being bent substantially simultaneously as when said leads are bent to the predetermined configuration.

According to this structure, the lead frame is connected to the leads by the connecting means in the packaged semiconductor produced by processing the lead frame by punching in order to form the plurality of leads and by mounting the semiconductor device on the lead frame and then sealing it with resin. This connecting means is bent at the same time the leads are bent. Hence a connection can be maintained between the leads and the lead frame after the bending of the leads is finished.

According to another aspect of the present invention, there is provided a process for manufacturing a packaged semiconductor, comprising the steps of:

mounting a semiconductor device having leads in a lead frame by using connecting means to connect the semiconductor device to the lead frame;

sealing said semiconductor device using a resin;

bending the leads of the semiconductor device to a predetermined configuration and substantially simultaneously bending the connecting means;

dipping said lead frame and a solder electrode in an acidic electrolyte to connect said lead frame to said solder electrode electrically thereby coating the surface of said leads with solder plating; and thereafter disconnecting the connection made by said connecting means.

According to this process, the packaged semiconductor provided with a package in which a semiconductor device is mounted on a lead frame in which a plurality of leads have been formed by punching and which is sealed using a resin, wherein the leads extending from the side of the package are formed by bending, is manufactured by the first to fourth steps given below.

Specifically, in the first step, the lead frame and the semiconductor device are sealed with a resin to form a package.

In the second step, the connecting means which connects the lead to the lead frame is bent at the same time the lead is bent.

In the third step, the lead frame and the solder electrode are dipped in the acidic electrolyte and the lead frame is electrically connected to the solder electrode to provide the surface of the lead with solder plating.

Finally, in the fourth step, the connection made by the connecting means is terminated.

The production of a packaged semiconductor according to the above manufacturing process ensures that since solder plating can be provided on the surface of the lead after the lead is bent, the solder plating formed on the surface of the lead does not peel off and no solder residue is produced.

According to another aspect of the present invention, there is provided a device for forming a packaged semiconductor, the device comprising:

a semiconductor having a plurality of leads extending therefrom;

a lead frame in which the semiconductor device is mounted; and an elongated connection member having opposite longitudinal edges, with one longitudinal edge connected to the lead frame and the opposite longitudinal edge connected to a lead of the semiconductor device.

DETAILED DESCRIPTION OF THE INVENTION

Figure 1:
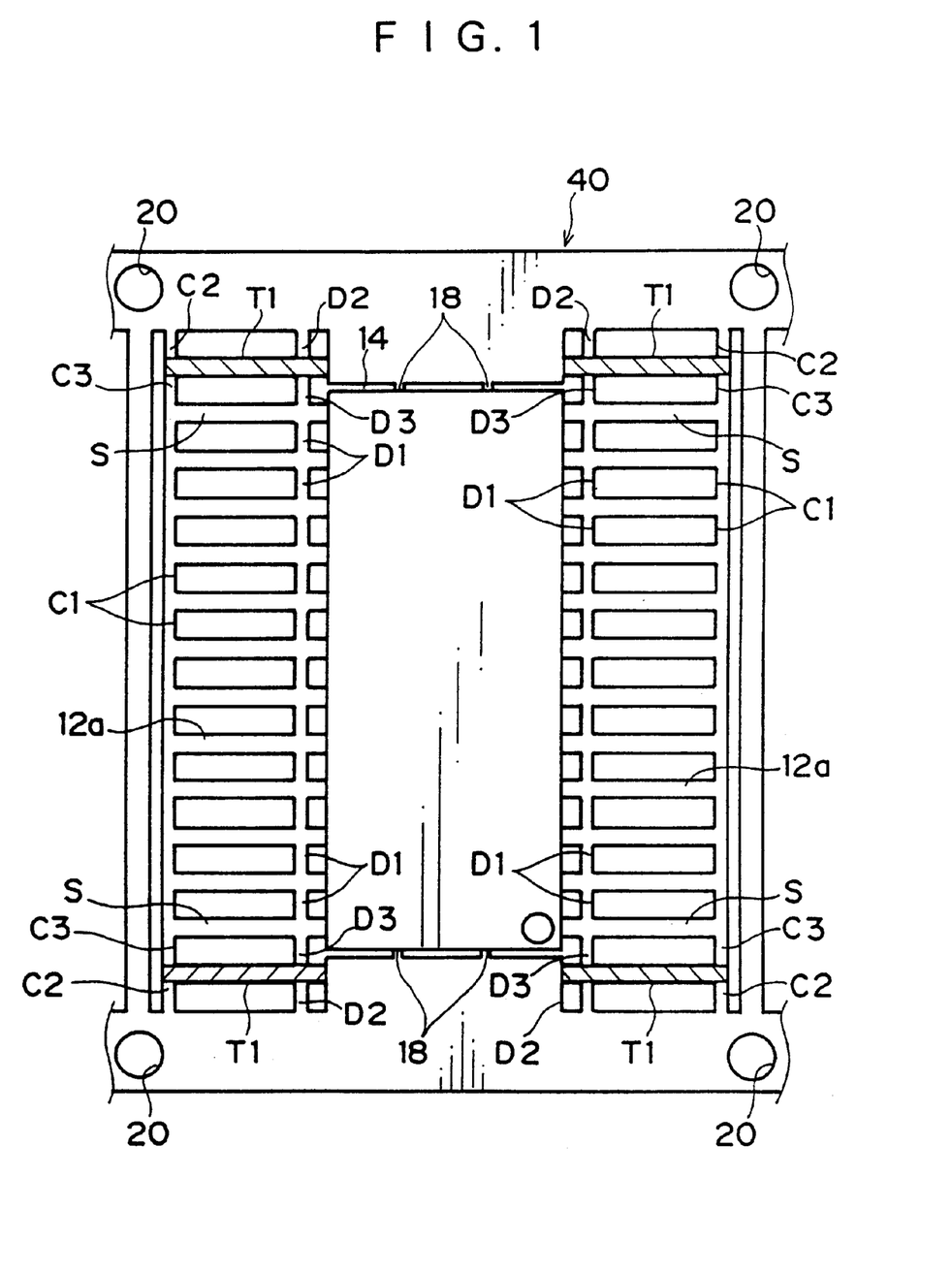
FIG. 1 is a top plan view showing the condition of a lead frame before it is bent, the lead frame being used in a packaged semiconductor according to a first embodiment of the present invention.
Figure 2A:
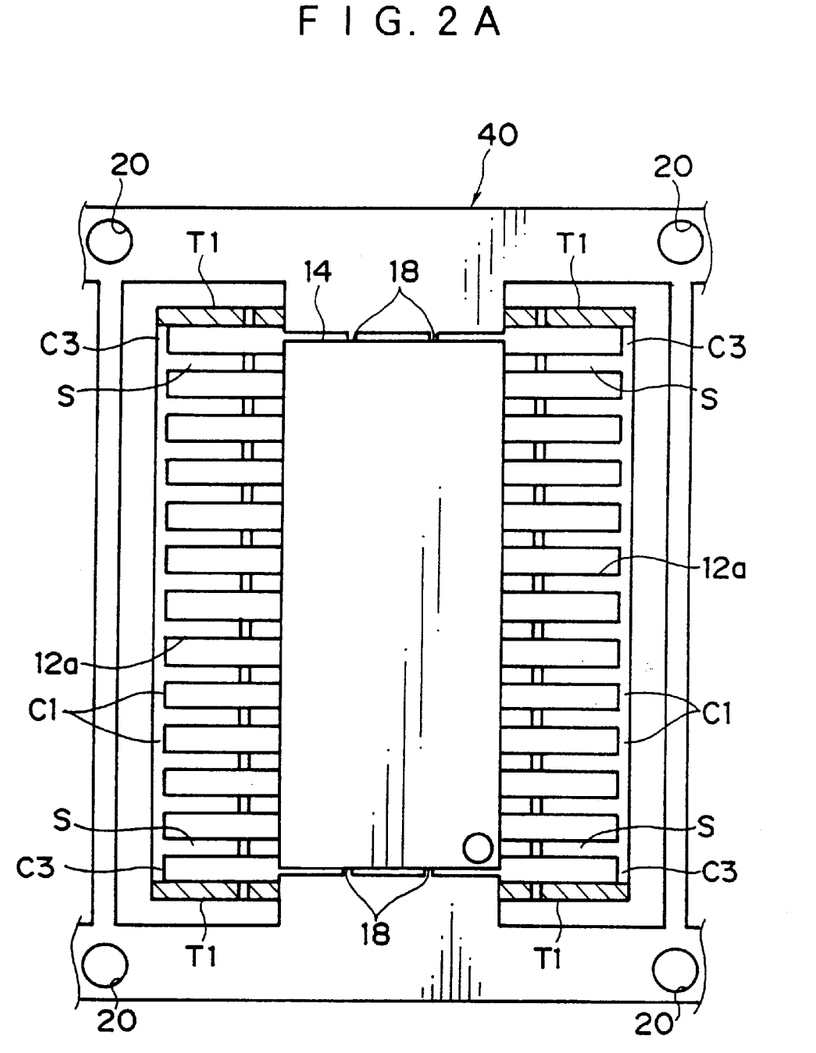
FIG. 2A is a top plan view showing the condition of the lead frame shown in FIG. 1 after it is bent and FIG. 2B is a side view thereof.
Figure 2B:
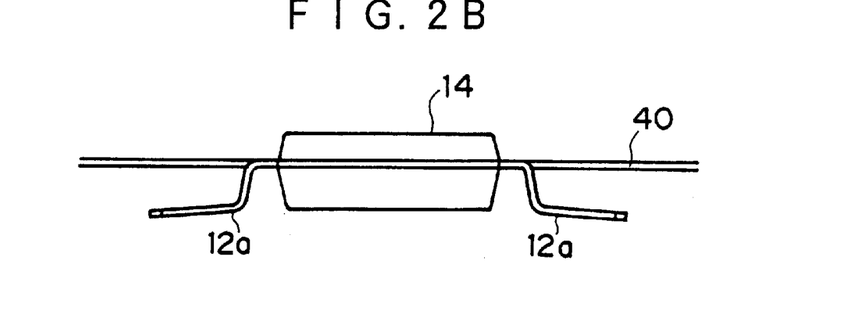

A packaged semiconductor according to a first embodiment of the present invention will be hereinafter explained with reference to the drawings. FIG. 1 is a top plan view showing the condition of a lead frame before the leads are bent. FIG. 2A is a top plan view showing the condition of the lead frame after the leads and connecting means are bent and FIG. 2B is a side view thereof.

The parts having the same structures as in the conventional art are represented by the same symbols in the following explanations for the sake of convenience.

As shown in FIG. 1, the plurality of leads 12a are formed by processing a lead frame 40 by punching. These leads 12a are joined (connected) with each other through two tie bars C1 and D1. One of these tie bars C1 and D1 is a dam bar D1 having the function of blocking the flow of resin in the molding of the package 14 explained below.

Four leads 12a (these particular leads are hereinafter called "end leads S") positioned on the outermost sides of the plurality of leads 12a formed in the lead frame 40 are connected to a extraneous leads T1 (the shaded portion in FIG. 1), which are integrated with the lead frame 40, through tie bars C3 and D3. The extraneous leads T1 are connected to the lead frame 40 through two tie bars C2 and D2.

It is to be noted that the extraneous leads T1 are formed by punching the lead frame 40 in the same shape as the other leads 12a and have a shape of substantially the same dimensions as each of the other leads 12a with respect to length and width.

In the center position of the lead frame 40, an island portion on which with an unillustrated semiconductor device is to be mounted, is integrated with the lead frame 40. The island portion is connected to the lead frame 40 at a section corresponding to the outer frame of the lead frame 40 through an island pin 18.

It is to be noted that circular guide holes 20 for positioning the lead frame 40 on a forming die 22 are formed in the lead frame 40 during the bending of the leads 12a.

Next, a process for manufacturing a packaged semiconductor according to this embodiment will be explained.

First, a semiconductor device (chip) is mounted on the above island portion of the lead frame 40 and sealed using a resin together with the lead frame 40 to produce the package 14 (the first step). Then, the tie bars C2 and D2 which connect the lead frame 40 to the extraneous leads T1 are cut by punching using a metal mold. At the same time, the tie bars D1 and D3 are cut by punching. At this time, the leads 12a are connected to each other through the tie bar C1 and also to the extraneous leads T1 through the tie bar C3. The extraneous leads T1 are integrated with the lead frame 40.

Next, when the lead frame 40 is automatically conveyed onto a bending die 24 of the forming die 22 for bending as shown in FIG. 9, the upper die 25 descends whereby pilot pins 26 penetrate through the guide holes 20 of the lead frame 40. At this time, the leads 12a located in the vicinity of the package 14 are sandwiched together with the package 14 between a knockout 28 forced by a spring 30 and the bending die 24. The lead frame 40 is thereby positioned in the forming die 22.

Subsequently, the bending punch 32 descends to push down the lead 12a and the extraneous leads T1 at the same time thereby performing bending. When the bending is performed, as shown in FIG. 2B, the leads 12a and the extraneous leads T1 are bent respectively into the form of an L-character in section (the second step).

Figure 3:
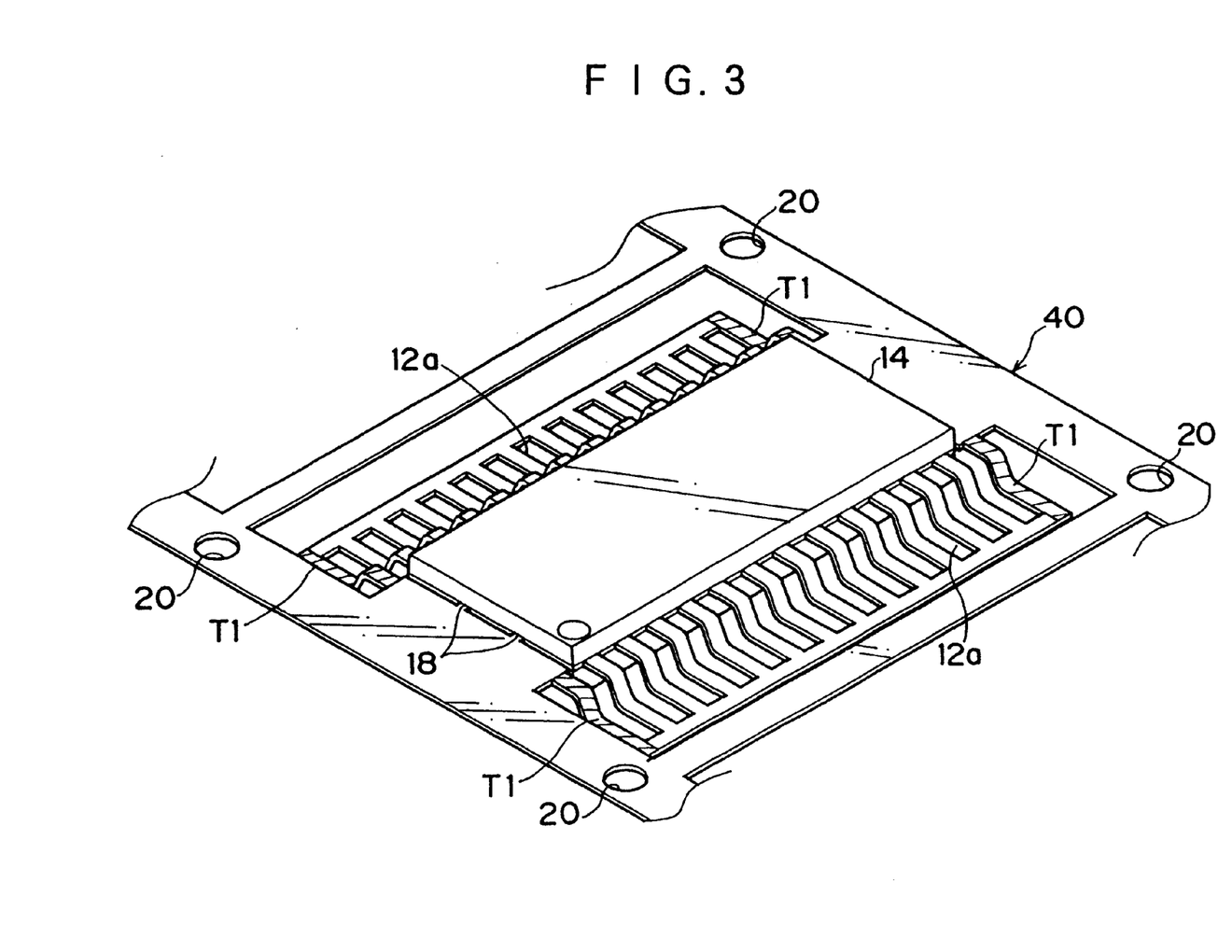
FIG. 3 is a perspective view showing the condition of the lead frame after it is bent, the lead frame being used in the packaged semiconductor according to the first embodiment of the present invention.

Here, as shown in FIG. 3, even after the leads 12a are bent, the leads 12a are not separated from the lead frame 40 since the extraneous leads T1 are connected to the lead frame 40.

Next, the surface of the lead frame 40 is provided with solder plating (the third step). Specifically, as shown in FIG. 11, the bent lead frame 40 is immersed together with a solder electrode 11 in an acidic electrolyte 13 to connect the solder electrode 11 electrically to the lead frame 40. Then, as described in the section "Prior art", the lead frame 40 is energized to deposit solder on the surface of the lead frame 40 (leads 12a).

Thereafter, the lead frame 40 on which the solder is deposited is taken out of the electrolyte 13 and the distal end of the leads 12a and extraneous leads T1 are cut together with the tie bars C1 and C3. By further cutting the island support pins 18, the package 14 and the leads 12a are cut off from the lead frame 40 to obtain a packaged semiconductor 10 (see FIG. 10) (the fourth step).

According to the packaged semiconductor 10 of this embodiment, as stated above, the leads 12a are connected to the extraneous leads T1 which is integrated with the lead frame 40. Also, each lead 12a and the extraneous lead T1 is bent at the same time so that the connection between the leads 12a and the lead frame 40 can be maintained.

According to the process for the production of the packaged semiconductor 10 provided with the lead frame 40, the connection between the leads 12a and the lead frame 40 can be maintained by bending the leads 12a and the extraneous leads T1 at the same time. The lead frame 40 can be provided with solder plating accordingly after the bending process.

As a result, the solder plating of the lead 12a is not peeled off by the bending punch 32 and no solder residue is produced. This prevents a reduction in the quality of the packaged semiconductor 10 and avoids the necessity of cleaning the forming die 22 to remove solder residue. Thus, a highly productive and high quality packaged semiconductor 10 can be manufactured.

Next, a packaged semiconductor according to a second embodiment will be explained.

The lead frame 41 used in the packaged semiconductor 10 according to the second embodiment is the same as the packaged semiconductor of the first embodiment except that the shape of the extraneous lead T1 of the lead frame 40 used in the first embodiment is changed. Therefore, the parts having the same structure as in the first embodiment are represented by the same symbols and are omitted where appropriate from the explanation below.

Figure 4:
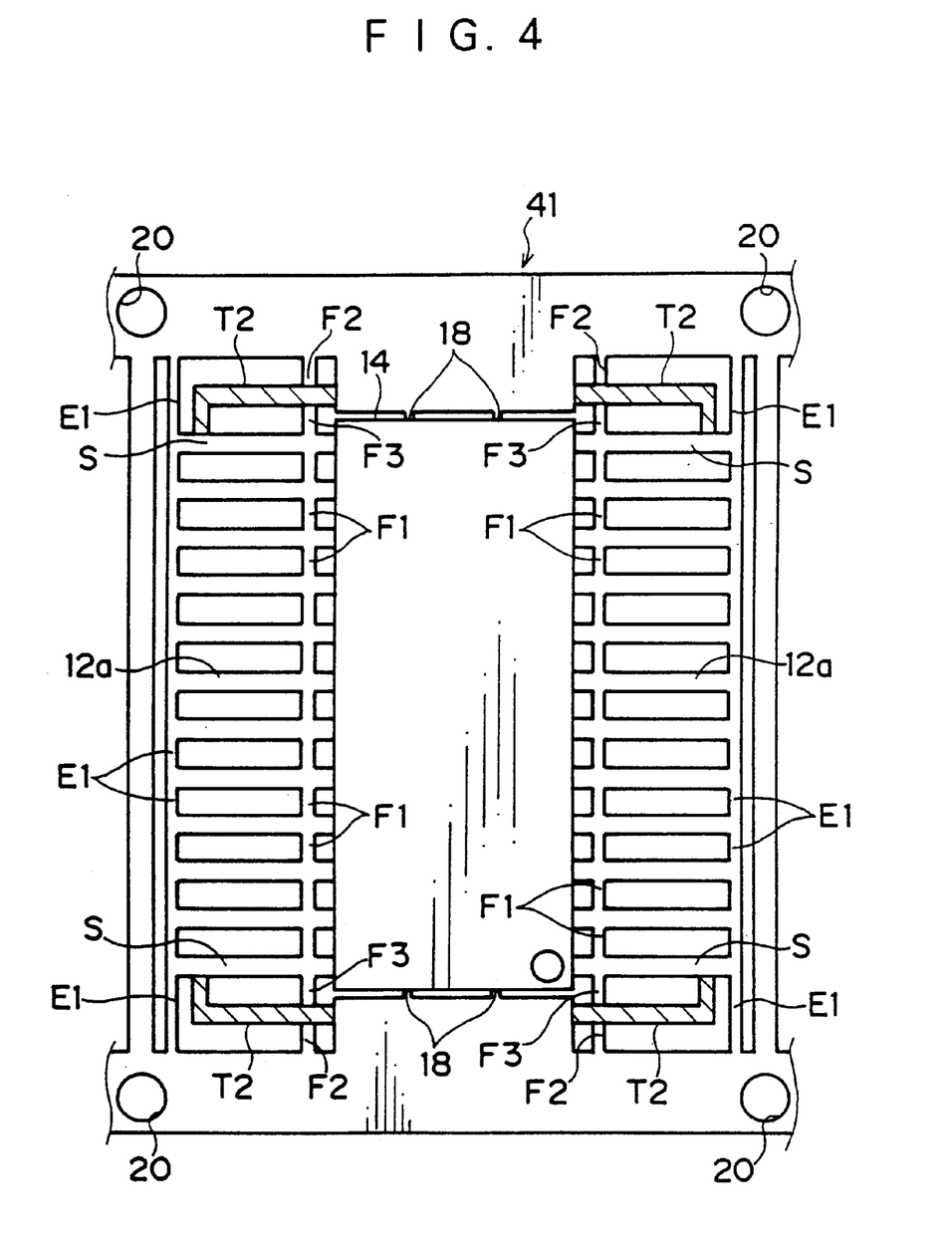
FIG. 4 is a top plan view showing the condition of a lead frame before it is bent, the lead frame being used in a packaged semiconductor according to a second embodiment of the present invention.

As shown in FIG. 4, extraneous leads T2 (the shaded portion in FIG. 4) connected to leads 12a are integrated with a lead frame 41 and the distal end thereof is connected to a side of an end lead S. The extraneous leads T2 are formed in an L-character form when seen in plan view.

On the other hand, the distal ends of the leads 12a are connected to each other through a tie bar E1 and also the end leads S are connected to the lead frame 41 through the tie bar E1. Further, the leads 12a located in the vicinity of the package 14 are connected to each other through a tie bar F1. The end leads S are connected to the extraneous leads T2 through a tie bar F3 and the extraneous lead T2 are connected to the lead frame 41 through a tie bar F2.

Moreover, an island portion is connected to the lead frame 41 through island pins 18.

Next, in a process for manufacturing the packaged semiconductor 10 provided with the lead frame 41, firstly the tie bars E1 connecting the end leads S to the lead frame 41, the tie bars F2 connecting the extraneous leads T2 to the lead frame 41, the tie bars F3 connecting the extraneous leads T2 to the end leads S and the tie bars F1 connecting the leads 12a to each other are cut in the same manner as in the first embodiment.

Figure 5A:
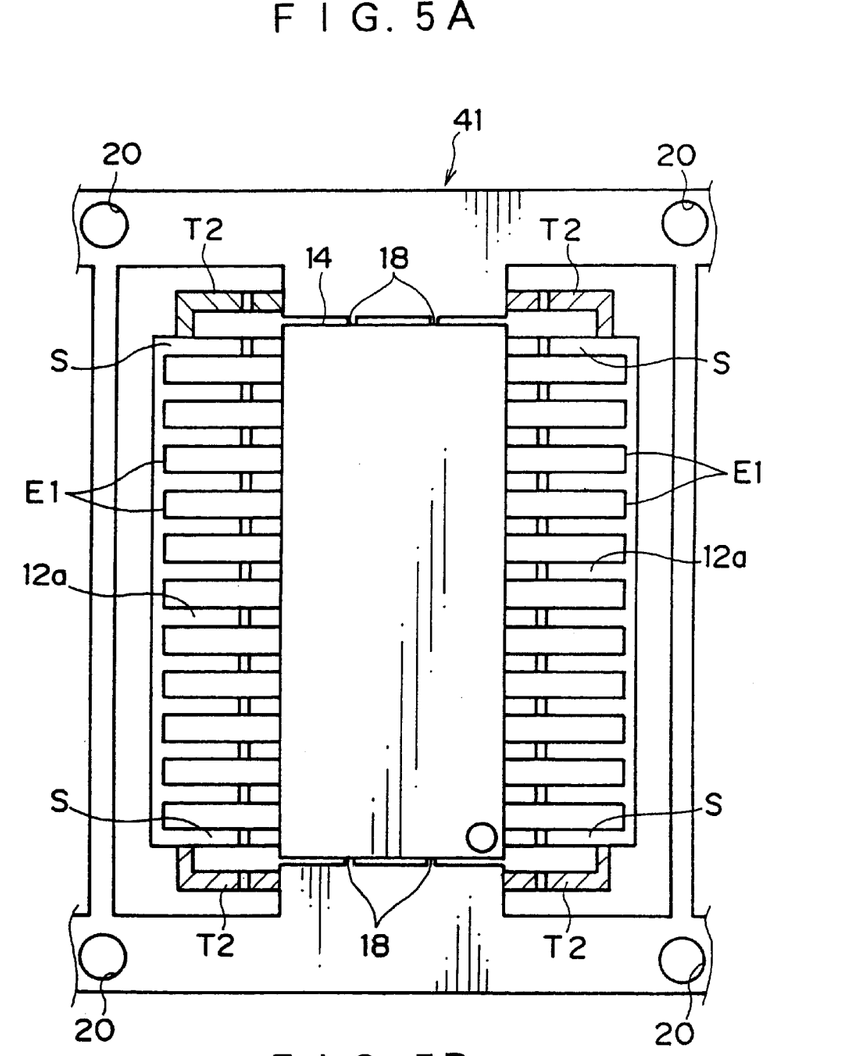
FIG. 5A is a top plan view showing the condition of the lead frame shown in FIG. 4 after it is bent and FIG. 5B is a side view thereof.
Figure 5B:
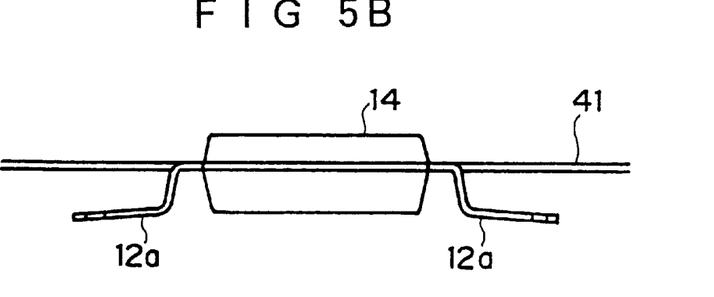
Figure 6:
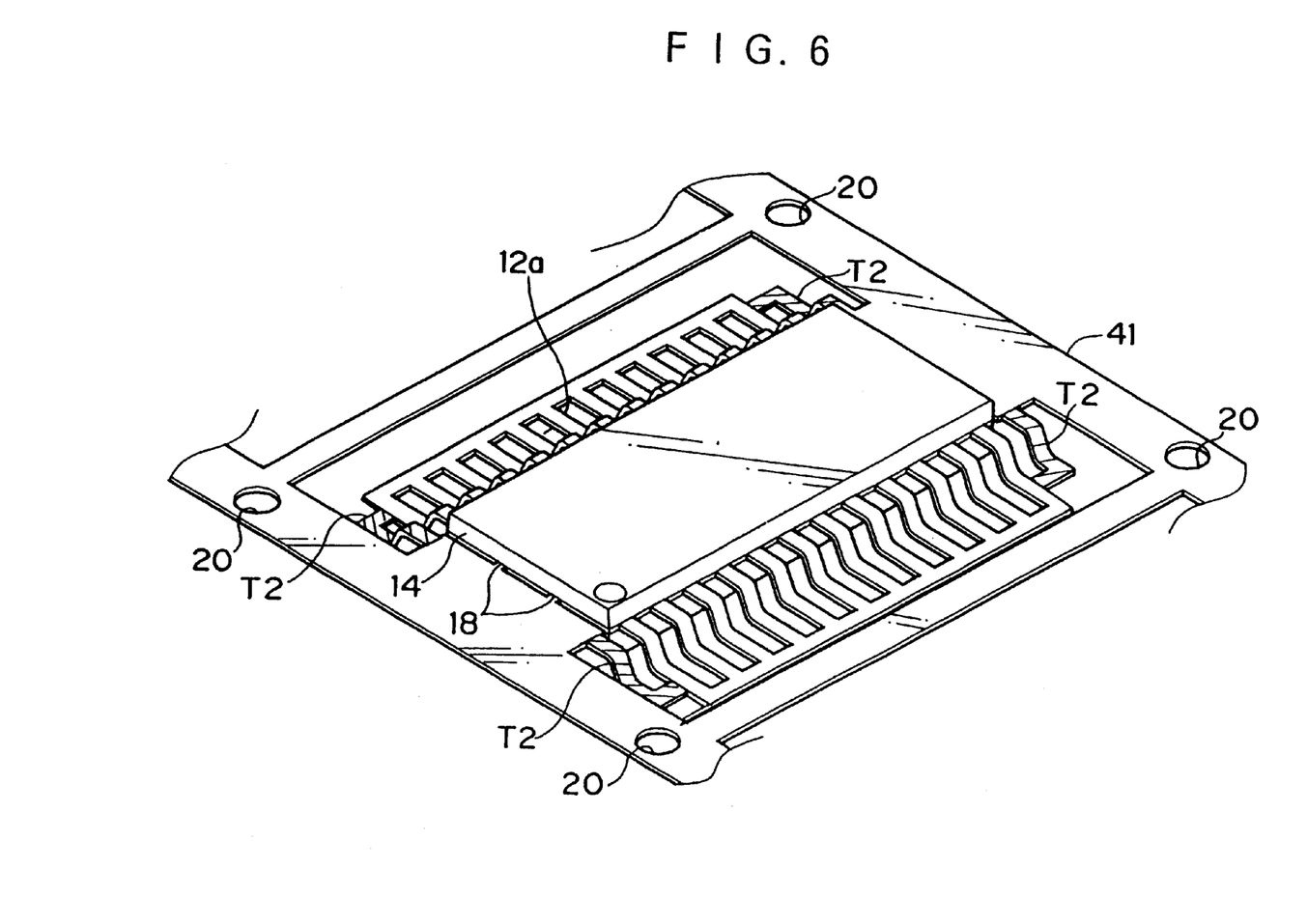
FIG. 6 is a perspective view showing the condition of the lead frame after it is bent, the lead frame being used in the packaged semiconductor according to the second embodiment of the present invention.

Next, as shown in FIG. 5A and FIG. 5B, each lead 12a and useless lead T2 is bent at the same time by the forming die 22. Then, as shown in FIG. 11, the lead frame 41 and the solder electrode 11 are immersed the acidic electrolyte 13 to connect the lead frame 41 electrically to the solder electrode 11. Thereafter, the lead frame 41 is energized to provide the surface of the lead frame 41 (leads 12a) with solder plating by utilizing electric energy.

The leads 12a provided with solder plating are cut to a prescribed length (cut at a position closer to the side of the package 14 than the joint portion between the extraneous leads T2 and the end leads S). Further, the island support pins 18 are cut. The packaged semiconductor 10 as shown in FIG. 10 is thus obtained.

In this embodiment also, as stated above, the leads 12a and the useless leads T2 are bent at the same time. Therefore, the connection between the leads 12a and the useless leads T2, that is, between the leads 12a and the lead frame 41 can be maintained.

Also, according to the packaged semiconductor 10 provided with the lead frame 41, the lead frame 41 can be plated using solder after the leads 12a are bent and hence the solder plating of the lead 12a is not peeled off by the punch 32 in the bending process thereby preventing the production of solder residue. As a result, the necessity of cleaning the forming die 22 to remove the solder residue is avoided. Thus, a highly productive and high quality packaged semiconductor 10 can be manufactured.

Incidentally, the lead frames 40 and 41 respectively used in each of the above embodiments are represented in a form applicable to the semiconductor 10. However, if extraneous leads are formed on the outside of the end leads S and the lead frame 40 or 41 is still connected to the leads 12a after the bending process is finished, this lead frame 40 or 41 can be applied to other electronic parts which are to be provided with solder plating.

According to the packaged semiconductor of the present invention a lead is not cut off from a lead frame, and the connection between the two can be maintained even after a bending process is finished.

According to the process for the production of a packaged semiconductor, since the surface of a lead frame can be provided with solder plating after a lead is bent, the solder plating formed on the surface of the lead is not peeled off by bending and hence the production of solder residue can be avoided.

What is claimed is:

1. A process for manufacturing a packaged semiconductor, comprising the steps of:
   (a) mounting a semiconductor device having leads in a lead frame by using connecting means to connect the semiconductor device to the lead frame;
   (b) sealing said semiconductor device using a resin;
   (c) bending the leads of the semiconductor device to a predetermined configuration and substantially simultaneously bending the connecting means;

(d) dipping said lead frame and a solder electrode in an acidic electrolyte to connect said lead frame to said solder electrode electrically thereby coating the surface of said leads with solder plating; and thereafter (e) disconnecting the connection made by said connecting means.

2. The process of claim 1, wherein the step of mounting, includes the sub-steps of:

(a) forming an elongated member having opposite longitudinal edges as the connecting means;

(b) connecting one longitudinal edge to the lead frame; and (c) connecting the opposite longitudinal edge to a lead of the semiconductor device.

3. The process of claim 1, wherein the step of mounting, includes the sub-steps of:

(a) forming an L-shaped member having two legs as the connecting member;

(b) connecting one leg to the lead frame; and (c) connecting the other leg to a lead of the semiconductor device.

4. The process of claim 3, wherein the step of forming an L-shaped member, includes making one leg longer than the other.

5. The process of claim 4, wherein in the step connecting one leg to the lead frame, the shorter leg, is attached to the lead frame.

* * * * *